United States Patent
Fujii et al.

(10) Patent No.: US 7,517,575 B2
(45) Date of Patent: Apr. 14, 2009

(54) OPTICAL INFORMATION RECORDING MEDIA AND SILVER ALLOY REFLECTIVE FILMS FOR THE SAME

(75) Inventors: Hideo Fujii, Kobe (JP); Yuki Tauchi, Kobe (JP); Junichi Nakai, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 31 days.

(21) Appl. No.: 11/428,045

(22) Filed: Jun. 30, 2006

(65) Prior Publication Data

US 2007/0020427 A1 Jan. 25, 2007

(30) Foreign Application Priority Data

Jul. 22, 2005 (JP) ............... 2005-213204

(51) Int. Cl.
*B32B 3/02* (2006.01)

(52) U.S. Cl. ............... 428/64.1; 428/64.4; 430/270.11

(58) Field of Classification Search ............... 428/64.1, 428/64.4; 430/270.12

See application file for complete search history.

(56) References Cited

U.S. PATENT DOCUMENTS

| | | | |
|---|---|---|---|
| 4,998,239 A * | 3/1991 | Strandjord et al. | 369/275.1 |
| 5,948,497 A | 9/1999 | Hatwar et al. | |
| 5,989,669 A * | 11/1999 | Usami | 428/64.1 |
| 6,007,889 A | 12/1999 | Nee | |
| 6,229,785 B1 | 5/2001 | Kitaura et al. | |
| 6,280,811 B1 | 8/2001 | Nee | |
| 6,544,616 B2 | 4/2003 | Nee | |
| 6,689,444 B2 * | 2/2004 | Nakai et al. | 428/64.1 |
| 7,018,696 B2 | 3/2006 | Nee | |
| 7,022,384 B2 | 4/2006 | Fujii et al. | |
| 2004/0028912 A1 | 2/2004 | Tauchi et al. | |
| 2004/0226818 A1 | 11/2004 | Takagi et al. | |
| 2004/0238356 A1 | 12/2004 | Matsuzaki et al. | |

(Continued)

FOREIGN PATENT DOCUMENTS

CN 1483852 3/2004

(Continued)

OTHER PUBLICATIONS

U.S. Appl. No. 11/353,168, filed Feb. 14, 2006, Yuuki Tauchi, et al.

(Continued)

*Primary Examiner*—Elizabeth Mulvaney
(74) *Attorney, Agent, or Firm*—Oblon, Spivak, McClelland, Maier & Neustadt, P.C.

(57) ABSTRACT

A silver alloy reflective film contains X1 as a component and has an enriched layer located in a region within 2 nm deep from the surface of the reflective film, in which the component X1 is enriched in the enriched layer at a higher concentration than the average concentration of X1 in the whole of the reflective film, wherein X1 is at least one alloying element selected from the group consisting of Bi, Si, Ge, Pb, Zn, Cd, Hg, Al, Ga, In, Tl, Sn, As, and Sb. The reflective film has stable and excellent basic properties as reflective films, such as initial reflectivity and durability, and satisfies further requirements, such as laser marking suitability. An optical information recording medium includes the reflective film and is excellent.

16 Claims, 1 Drawing Sheet

U.S. PATENT DOCUMENTS

| | | |
|---|---|---|
| 2004/0263984 A1 | 12/2004 | Nakai et al. |
| 2005/0008883 A1 | 1/2005 | Takagi et al. |
| 2005/0112019 A1 | 5/2005 | Nakai et al. |
| 2005/0153162 A1 | 7/2005 | Takagi et al. |
| 2005/0238839 A1 | 10/2005 | Takagi et al. |
| 2005/0287333 A1 | 12/2005 | Takagi et al. |
| 2006/0013988 A1 | 1/2006 | Tauchi et al. |
| 2006/0104853 A1 | 5/2006 | Tauchi et al. |
| 2007/0020427 A1 | 1/2007 | Fujii et al. |

FOREIGN PATENT DOCUMENTS

| | | |
|---|---|---|
| EP | 1 589 531 A2 | 10/2005 |
| JP | 61-006220 | 1/1986 |
| JP | 61-006223 | 1/1986 |
| JP | 62-130245 | 6/1987 |
| JP | 4-28032 | 1/1992 |
| JP | 4-252440 | 9/1992 |
| JP | 5-258363 | 10/1993 |
| JP | 6-208732 | 7/1994 |
| JP | 06-243509 | 9/1994 |
| JP | 2000-57627 | 2/2000 |
| JP | 2001-035014 | 2/2001 |
| JP | 2001-184725 | 7/2001 |
| JP | 2002-117587 | 4/2002 |
| JP | 2003-160826 | 6/2003 |
| JP | 2004-158145 | 6/2004 |
| WO | WO98/09823 | 3/1998 |
| WO | WO 2004/094135 A1 | 11/2004 |

OTHER PUBLICATIONS

U.S. Appl. No. 11/395,227, filed Apr. 3, 2006, Yuuki Tauchi, et al.
U.S. Appl. No. 11/401,853, filed Apr. 12, 2006, Yuuki Tauchi, et al.
U.S. Appl. No. 11/333,492, filed Jan. 18, 2006, Yuuki Tauchi, et al.
U.S. Appl. No. 11/375,036, filed Mar. 15, 2006, Yuuki Tauchi, et al.
U.S. Appl. No. 11/428,045, filed Jun. 30, 2006, Fujii, et al.
U.S. Appl. No. 11/425,062, filed Jun. 19, 2006, Tauchi, et al.
U.S. Appl. No. 11/425,068, filed Jun. 19, 2006, Nakai, et al.
U.S. Appl. No. 11/612,791, filed Dec. 19, 2006, Nakano, et al.
U.S. Appl. No. 12/167,597, filed Jul. 3, 2008, Takagi, et al.
U.S. Appl. No. 12/183,700, filed Jul. 31, 2008, Tauchi, et al.
U.S. Appl. No. 12/198,520, filed Aug. 26, 2008, Tauchi, et al.
U.S. Appl. No. 12/100,823, filed Apr. 10, 2008, Tauchi, et al.

* cited by examiner

OPTICAL INFORMATION RECORDING MEDIA AND SILVER ALLOY REFLECTIVE FILMS FOR THE SAME

BACKGROUND OF THE INVENTION

1. Field of the Invention

The present invention relates to silver (Ag) alloy reflective films for optical information recording media, and optical information recording media having the Ag alloy reflective films. More specifically, it relates to reflective films which have low thermal conductivities, low melting temperatures, high reflectivities, and high corrosion resistance and therefore enable marking of optical information recording media such as CDs, DVDs, Blu-ray Discs, and HD-DVDs typically using laser beam after the preparation of the media. It also relates to optical information recording media having the reflective films.

2. Description of the Related Art

Optical information recording media (optical discs) include various types, and the three main types categorized by the writing/reading system are read-only, write-once, and rewritable optical discs.

Of these optical discs, read-only discs have recorded data formed by concave and convex pits on a transparent plastic substrate such as a polycarbonate substrate upon the manufacture of the discs, and a reflective layer mainly containing, for example, Al, Ag, or Au is arranged on the recorded data, as illustrated in FIG. 1. The data are read out by detecting phase difference or reflection difference of laser beam applied to the discs. Certain optical discs include a substrate containing recording pits and a reflective layer arranged on the recording pits, and another substrate bearing recording pits and a semi-reflective layer arranged on the recording pits. The two substrates are laminated, and the data recorded on the two layers are read out. Data recorded on one side according to this recording/reading system are read-only data that cannot be additionally wrote and altered. Optical discs using this system include CD-ROMs, DVD-ROMs, and DVD-Videos. FIG. 1 is a schematic view of the sectional structure of a read-only optical disc. The optical disc in FIG. 1 includes polycarbonate substrates 1 and 5, a semi-reflective layer (Au, Ag alloy, and Si) 2, an adhesive layer 3, and a total-reflective film layer (Ag alloy) 4.

These read-only optical discs are produced in quantities, and information is recorded upon production of the discs by pressing with stampers having patterns of the information. Thus, IDs cannot be significantly given to individual discs. However, read-only optical discs individually having IDs formed using a dedicated system such as a label gate system or a burst cutting area (BCA) system after the preparation of the discs are being standardized typically for preventing unauthorized copying, improving traceability in distribution of products, and increasing added values of products. The ID marking (recording) is mainly carried out by a method of applying laser beam to discs after production to melt an Al alloy in the reflective film and to form holes therein.

Aluminum alloys, such as Al—Mg alloys according to Japanese Industrial Standards (JIS) 6061, are distributed in quantities as general construction materials, are inexpensive and have been thereby widely used as reflective films of read-only optical discs.

The JIS 6061 Al alloys, however, are not intended to undergo laser marking and thereby have following problems.

Specifically, the Al alloys have high thermal conductivities and require high laser power for marking, which results in damages on base materials including polycarbonate substrates and adhesive layers. Additionally, voids formed as a result of laser marking invite corrosion of the reflective film, if left under conditions of high temperatures and high humidity after laser marking, because the Al alloys have low corrosion resistance.

Recordable (write-once and rewritable) optical discs often use Ag alloys having higher reflectivities as reflective films. The resulting reflective films containing Ag alloys, however, show decreased reflectivities at high temperatures caused by cohesion of Ag due to the low heat resistance of Ag. Various proposals have been made to solve these problems and to improve the durability. For example, Japanese Laid-open (Unexamined) Patent Application Publication (JP-A) No. 2002-15464 discloses a technique of inhibiting the grain growth (cohesion) of Ag by incorporating 0.1 to 3 atomic percent of a rare-earth element into Ag. JP-A No. 2004-139712 discloses a technique of further improving reflectivity and durability while ensuring high thermal conductivity by incorporating Bi or Sb into Ag.

JP-A No. 04-252440 discloses a method for reducing the thermal conductivity of an Ag alloy by incorporating Ge, Si, Sn, Pb, Ga, In, Tl, Sb, or Bi into Ag. JP-A No. 04-28032 discloses a method for reducing the thermal conductivity of an Ag alloy by incorporating Cr, Ti, Si, Ta, Nb, Pt, Ir, Fe, Re, Sb, Zr, Sn, or Ni into Ag. The resulting reflective films according to these techniques, however, are not intended to be melted and removed by laser irradiation, and some of them show increasing melting temperatures with decreasing thermal conductivities thereof. Silver alloys (Ag alloys) satisfying requirements as Ag alloys suitable for laser marking have not yet been provided.

As possible solutions to these problems, the present inventors proposed novel Ag alloy reflective films suitable for laser marking in Japanese Patent Applications No. 2005-67262 and No. 2005-117313.

However, further improvements have still been demanded, because simple addition of large amounts of such alloying elements for satisfactory laser marking suitability may reduce initial properties of the resulting films, result in decreased corrosion resistance, or result in insufficient durability in some cases.

SUMMARY OF THE INVENTION

Accordingly, an object of the present invention is to solve the problems in conventional technologies and to provide an Ag alloy reflective film for optical information recording media that has stable and excellent basic properties as reflective films, such as initial reflectivity and durability, and satisfies further requirements, such as laser marking suitability. Another object of the present invention is to provide an excellent optical information recording medium having the reflective film.

After intensive investigations to achieve the objects, the present inventors have found the following configurations can achieve the objects.

Specifically, the present invention provides, in a first aspect, (1) an Ag alloy reflective film containing X1 as a component, in which the Ag alloy reflective film includes an enriched layer located in a region within 2 nm deep from the surface of the reflective film, and the component X1 is enriched in the enriched layer at a higher concentration than the average concentration of X1 in the whole of the reflective film, wherein X1 is at least one alloying element selected from the group consisting of Bi, Si, Ge, Pb, Zn, Cd, Hg, Al, Ga, In, Tl, Sn, As, and Sb.

(2) The Ag alloy reflective film can contain a total of 0.01 to 3 atomic percent of Bi as the component X1 in the whole of the reflective film.

(3) The present invention further provides, in a second aspect, an Ag alloy reflective film containing X1 and Y1 as components, in which the Ag alloy reflective film includes an enriched layer located in a region within 2 nm deep from the surface of the reflective film, and the component X1 is enriched in the enriched layer at a higher concentration than the average concentration of X1 in the whole of the reflective film, wherein X1 is at least one alloying element selected from the group consisting of Bi, Si, Ge, Pb, Zn, Cd, Hg, Al, Ga, In, Tl, Sn, As, and Sb; and Y1 is at least one alloying element selected from the group consisting of Nd, Sn, In, Gd, Zn and Al.

(4) The Ag alloy reflective film of the second aspect can contain a total of 0.01 to 3 atomic percent of Bi as the component X1; and a total of 6 to 20 atomic percent of at least one selected from the group consisting of Nd, Sn, In, Gd, Zn, and Al as Y1.

(5) In addition and advantageously, the present invention provides an optical information recording medium including any of the Ag alloy reflective films according to the present invention.

The Ag alloy reflective films for optical information recording media according to the present invention have excellent initial reflectivities and durabilities and can be suitably marked by laser beam when used in read-only optical discs. The optical information recording media according to the present invention include these reflective films and are excellent.

Further objects, features and advantages of the present invention will become apparent from the following description of the preferred embodiments with reference to the attached drawing.

DESCRIPTION OF THE PREFERRED EMBODIMENTS

Figure 1:
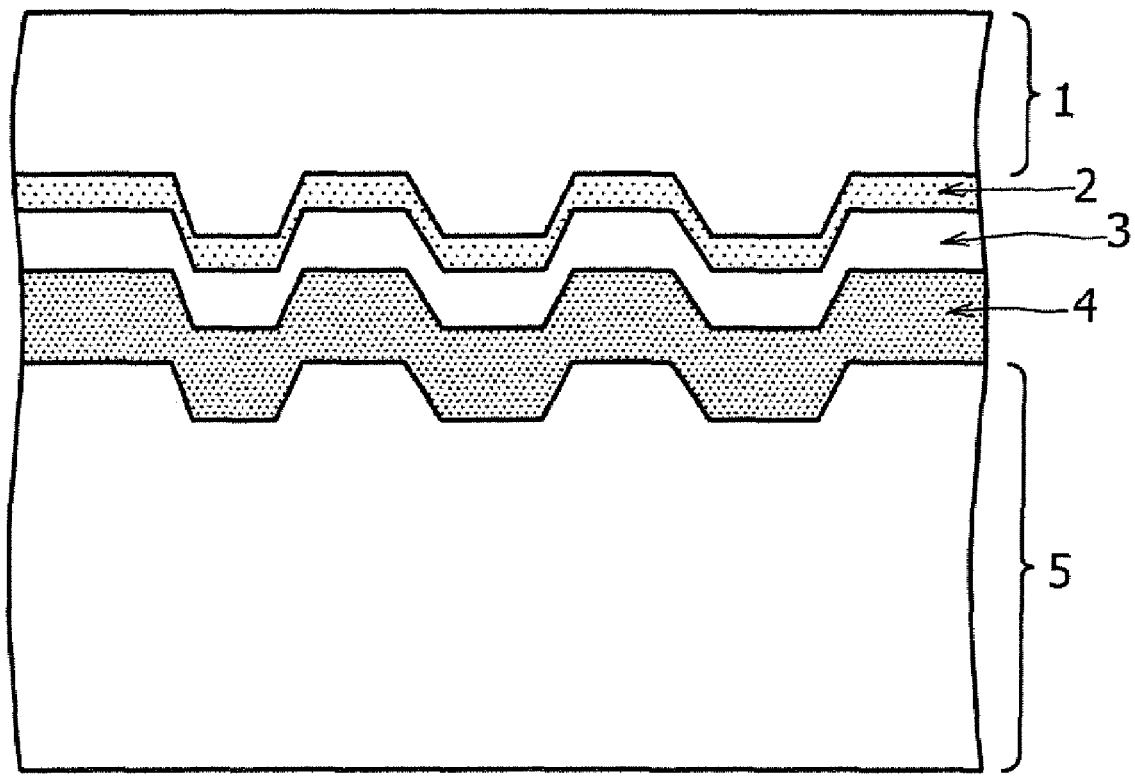
FIG. 1 is a schematic view of the sectional structure of a read-only optical disc.

As is described above, large amounts of alloying elements may cause problems, such as reduction in initial reflectivity and durability (corrosion resistance) of Ag alloy reflective films. After intensive investigations to avoid these problems in a novel approach, the present inventors have found that the basic properties important as reflective films can be improved and maintained at satisfactory level by suitably controlling the thickness of an enriched layer (enriched layer) of a specific alloying element in the outermost surface (surface layer) of an Ag alloy reflective film typically by adjusting film deposition conditions, as described in the after-mentioned experimental examples.

The Ag alloy reflective films preferably have a thickness of about 10 nm to about 200 nm for sufficient reflectivities and for laser marking at an appropriate energy. The "enriched layer" of a specific alloying element refers to a region within 2 nm deep from the outermost surface toward the inside of a reflective film having a thickness preferably within the above-specified range. The enriched layer is defined as a region in which the specific alloying element is enriched at a concentration higher than the average concentration thereof in the whole of the reflective film. The thickness of the enriched layer is referred to as a "thickness of the surficial enriched layer".

The enriched layer preferably has a gradient concentration of the alloying element which increases in a thickness direction toward the outermost surface in order to yield sufficient properties and high productivity. The concentration, however, does not necessarily have to vary continuously. Specifically, the concentration of the alloying element can be constant in the enriched layer in a thickness direction or can be a gradient concentration which decreases in a thickness direction toward the outermost surface, as long as the concentration of the alloying element in the enriched layer is higher than the average concentration thereof in the whole of the reflective film.

Hereinafter, an alloying element that constitutes the enriched layer and thereby imparts excellent advantages to the reflective film is referred to as "surficial enriched element" and is represented by X1. A silver alloy comprising the surficial enriched element X1 as a component is represented by "Ag—X1". Of course, the Ag—X1 alloys in the present invention essentially comprise X1 as a component and include Ag alloys further containing one or more other elements, such as alloying elements and other elements, in addition to Ag and X1. The layer thickness of the enriched layer containing the surficial enriched element X1 is referred to as "thickness of the surficial X1-enriched layer".

Among such surficial enriched elements, bismuth (Bi) is especially effective and preferred, because Bi can diffuse at a high rate in Ag so that the reaction between Bi and Ag and the formation of an intermetallic compound therebetween can be prevented. The resulting reflective film containing Bi as the surficial enriched element has a high initial reflectivity and excellent corrosion resistance and can thereby maintain durability at high level.

Other examples of the surficial enriched element X1 than Bi include Si, Ge, Pb, Zn, Cd, Hg, Al, Ga, In, Tl, Sn, As, and Sb. While not so effective as Bi, these elements can diffuse at a high rate in Ag, do not form intermetallic compounds with Ag and can thereby yield similar advantages. Accordingly, these elements can also be preferably used as the surficial enriched element X1. Each of these surficial enriched elements (X1) can be used alone or in combination. The total content of these elements other than Bi is preferably 0.01 to 10 atomic percent.

According to the present invention, it is essential to enrich the surficial enriched element (X1) in a very thin region within 2 nm deep from the outermost surface of the Ag alloy reflective film so as to ensure both high initial reflectivity and excellent durability. This is because the enriched layer acts as a barrier layer to inhibit cohesion of Ag so as to improve the durability; and the X1 concentration can be relatively decreased in the other region than the surficial enriched layer, which serves to maintain a high reflectivity near to that of pure Ag. If the thickness of the enriched layer exceeds 2 nm, the enriched layer significantly affects the reflectivity, and the initial reflectivity decreases, although the durability can be maintained at high level. Thus, the objects of the present invention cannot be achieved.

Such a very thin enriched layer of the element X1 can be formed in the vicinity of the outermost surface of the Ag alloy reflective film, for example, by the following method. Specifically, from their experiences, the present inventors have found that, when a film is deposited on a substrate by sputtering, secondary electrons and recoil argon (Ar) come into the surface of the substrate so as to elevate the effective temperature of the substrate to thereby enrich the element X1. They have also found that the temperature of the substrate surface is in correlation with the discharge voltage in sputtering and increases with an increasing discharge voltage. This is probably because the energy of the incident secondary electrons and recoil Ar is higher at a high discharge voltage than that at a low discharge voltage. It is therefore recommended to carry out sputtering at a low gas pressure and a high power so as to yield such a high discharge voltage to deposit the target reflective film comprising the enriched layer of the element X1. The thickness of the enriched layer can be easily controlled to 2 nm or less, by adjusting the deposition conditions as is described in the after-mentioned experimental examples.

The total content of Bi, if added to form an Ag—Bi alloy, is preferably 0.01 to 3 atomic percent. The resulting Ag—Bi alloy reflective film can have improved corrosion resistance and be significantly resistant to reduction in reflectivity under conditions of high temperatures and high humidity. Namely, it can have improved durability. If the Bi content is less than 0.01 atomic percent, such advantages may be insufficient. If it exceeds 3 atomic percent, the reflective film may have a decreased reflectivity or may undergo coloring.

The Ag alloy reflective films according to the present invention more preferably further comprise an appropriate amount of at least one alloying element (Y1) for further improving laser marking suitability, in addition to the enriched element X1. Such Ag alloys containing both X1 and Y1 are represented by "Ag—X1—Y1" alloys. Of course, the Ag—X1—Y1 alloys herein essentially comprise X1 and Y1 as components and include Ag alloys further comprising one or more other elements than X1 and Y1, such as alloying elements and other elements. The element Y1 effective for improving the laser marking suitability can be at least one selected from the group consisting of Nd, Sn, In, Gd, Zn, and Al. By incorporating these alloying elements, the reflective films can be further easily marked by laser beam, because they have lower thermal conductivities and higher laser beam absorptivities, in addition to high initial reflectivities and excellent durabilities. Thus, Ag alloy reflective films having excellent and stable basic properties and sufficient laser marking suitability satisfying the recent requirements can be obtained.

The total content of these alloying elements (Y1) is preferably 6 to 20 atomic percent and more preferably 10 to 15 atomic percent. If the total content is less than 6 atomic percent, the thermal conductivity may not be sufficiently effectively reduced. If it exceeds 20 atomic percent, the reflectivity may be excessively reduced.

The present invention will be illustrated in further detail with reference to several examples and comparative examples below. It is to be noted that the followings are only examples which by no means limit the scope of the present invention, and various changes and modifications are possible therein without departing from the teaching and scope of the present invention.

EXPERIMENTAL EXAMPLE 1

In Experimental Example 1, Ag—Bi alloy thin films comprising Bi as the surficial enriched element X1 were deposited, and the relationship of the thickness of the surficial Bi-enriched layer with the initial reflectivity and the corrosion resistance were determined.

As test samples, Ag—Bi alloy thin films were deposited on a glass substrate (Corning #1737) having a diameter of 50 mm and a thickness of 1 mm by DC magnetron sputtering. The deposition was carried out at a substrate temperature of 22° C., an Ar gas pressure of 0.5 to 10 mTorr, a deposition power density of 0.1 to 10 W/cm$^2$, and a base pressure of $5\times10^{-6}$ Torr or less. In this procedure, the surficial enriched layer as in the present invention was formed (deposited) under control by varying the Ar gas pressure and deposition power density.

An absolute reflectivity of a sample Ag alloy thin film deposited to a thickness of 100 nm was measured at a wavelength of 405 nm using the V-570 Ultraviolet and Visible Ray Spectrometer (JASCO Corporation) and this was defined as the reflectivity. The measured reflectivity was compared with the reflectivity of pure Ag, and the initial reflectivity was evaluated as follows. If the difference (reduction) between the two reflectivities is 3% or less, the sample is evaluated as "Good" in initial reflectivity. If the difference exceeds 3%, the sample is evaluated as "Failure" in initial reflectivity. The durability of a sample thin film was evaluated as follows. The sample thin film was subjected to an environmental test, and the reflectivities thereof before and after the environmental test were measured. If the change (reduction) in reflectivity after the environmental test as compared with that before the environmental test is 3% or less, the sample thin film was evaluated as "Good" in durability, and if it exceeds 3%, the sample was evaluated as "Failure" indurability. The environmental test was carried out at a temperature of 80° C. and relative humidity of 90% for a holding time of 100 hours.

The thickness of the surficial Bi-enriched layer was determined by measuring the Bi content in a thickness direction using Rutherford backscattering spectrometry (RBS). Another analysis/determination method such as sectional TEM-EDX1 line analysis can also be employed herein. The average Bi concentration (total Bi content) in the whole of the thin film was determined by inductively coupled plasma spectrometry analysis (ICP).

The results are shown in Table 1. Table 1 demonstrates that reflective films each having a surface Bi-enriched layer, in which the Bi content is higher than the Bi content in the whole of the reflective films, within 2 nm deep from the outermost surface show higher initial reflectivities and more excellent durabilities than reflective films having such a surface Bi-enriched layer in a region extending over the above mentioned region (Comparative Examples).

TABLE 1

| No. | | Ar gas pressure (mTorr) | Deposition power density (W/cm$^2$) | Composition (atomic %) | Thickness of surficial Bi-enriched layer *1 | Initial reflectivity *2 | Durability (change in reflectivity) *3 |
|---|---|---|---|---|---|---|---|
| 1-1 | Example | 0.5 | 2 | Ag—0.4Bi | Good | Good | Good |
| 1-2 | Example | 1.0 | 2 | Ag—0.5Bi | Good | Good | Good |
| 1-3 | Example | 2 | 2 | Ag—0.5Bi | Good | Good | Good |
| 1-4 | Com. Ex. | 5 | 2 | Ag—0.8Bi | Failure | Failure | Good |
| 1-5 | Com. Ex. | 10 | 2 | Ag—0.9Bi | Failure | Failure | Failure |
| 1-6 | Com. Ex. | 2 | 0.1 | Ag—0.7Bi | Failure | Failure | Good |

TABLE 1-continued

| No. | | Ar gas pressure (mTorr) | Deposition power density (W/cm$^2$) | Composition (atomic %) | Thickness of surficial Bi-enriched layer *1 | Initial reflectivity *2 | Durability (change in reflectivity) *3 |
|---|---|---|---|---|---|---|---|
| 1-7 | Example | 2 | 5 | Ag—0.5Bi | Good | Good | Good |
| 1-8 | Example | 2 | 10 | Ag—0.4Bi | Good | Good | Good |

*1: Good: 2 nm or less, Failure: more than 2 nm
*2: Good: 3% or less lower than the reflectivity of pure Ag, Failure: more than 3% lower than the reflectivity of pure Ag
*3: Good: 3% or less, Failure: more than 3%

EXPERIMENTAL EXAMPLE 2

In Experimental Example 2, Ag—Bi—Y1 multi-component thin films containing Bi as the surficial enriched element X1 and two selected from Nd, Sn, In, and Gd as the alloying elements Y1 were deposited, and the relationship of their marking suitablities with the initial reflectivities and the corrosion resistance were determined.

As test samples, Ag—Bi—Y1 multi-component thin films were deposited on a polycarbonate resin substrate having a thickness of 0.6 mm and a diameter of 12 cm by DC magnetron sputtering. The deposition was carried out at a substrate temperature of 22° C., an Ar gas pressure of 2 mTorr, a deposition power density of 1 W/cm$^2$, and a base pressure of 5×10$^{-5}$ Torr. In the resulting thin films, the surficial Bi-enriched layer had a thickness of 1 nm.

An absolute reflectivity of a sample Ag alloy thin film deposited to a thickness of 100 nm was measured at a wavelength of 405 nm using the V-570 Ultraviolet and Visible Ray Spectrometer (JASCO Corporation) and this was defined as the reflectivity. The laser marking suitability was determined as follows. A sample thin film deposited to a thickness of 80 nm was marked by laser beam using the POP-120-8R (Hitachi Computer Peripherals Co., Ltd.) at a laser spot size of 30 μm×1 μm and a beam speed of 5 meters per second. The resulting mark was observed under an optical microscope, and the areal ratio of the area of the mark (area of melted region) to the area of irradiated laser beam was determined by image processing analysis and calculation. A sample which required a laser power of less than 3 W to form a mark with an areal ratio of 80% or more was evaluated as "Excellent", one which required a laser power of 3 to 3.5 W was evaluated as "Good", and one which required a laser power of more than 3.5 W was evaluated as "Failure". The initial reflectivity and durability of a sample thin film were evaluated according to the criteria of Experimental Example 1.

The results are shown in Table 2. Table 2 demonstrates that the total contents of the alloying elements Y1s is preferably 6 to 20 atomic percent and more preferably 10 to 15 atomic percent in order to satisfy all the laser marking suitability, initial reflectivity, and durability sufficiently.

TABLE 2

| No. | | Composition (atomic %) | Laser marking suitability *1 | Initial reflectivity *2 | Durability (change in reflectivity) *3 | Evaluation |
|---|---|---|---|---|---|---|
| 2-1 | Referential Example | Ag—0.5Bi—1Nd—3In | Failure | Good | Good | Failure |
| 2-2 | Example | Ag—0.5Bi—2Nd—6In | Good | Good | Excellent | Good |
| 2-3 | Example | Ag—0.5Bi—4Gd—6In | Excellent | Good | Excellent | Excellent |
| 2-4 | Example | Ag—0.5Bi—5Gd—10Sn | Excellent | Good | Excellent | Excellent |
| 2-5 | Example | Ag—0.5Bi—10Gd—8In | Excellent | Good | Good | Good |
| 2-6 | Referential Example | Ag—0.5Bi—10Gd—15In | Excellent | Good | Failure | Failure |
| 2-7 | Referential Example | Ag—0.5Bi—15Gd—15In | Excellent | Failure | Failure | Failure |

*1: Excellent: less than 3 W, Good: 3 to 3.5 W, Failure: more than 3.5 W
*2: Good: 60% or more, Failure: less than 60%
*3: Excellent: less than 7%, Good: 7% to 10%, Failure: more than 10%

The Ag alloy reflective films for optical information recording media according to the present invention have high initial reflectivities and excellent durabilities and can be suitably marked by laser beam. They can thereby be advantageously used as reflective films for optical information recording media as read-only optical discs.

What is claimed is:

1. A silver alloy reflective film comprising:
   silver;
   a total of 0.01-3 atomic % of X1; and
   a total of 6-20 atomic % of Y1,
   wherein the silver alloy reflective film comprises an enriched layer located in a region within 2 nm deep from the surface of the silver alloy reflective film,
   wherein X1 is enriched in the enriched layer at a higher concentration than the average concentration of X1 in the whole of the silver alloy reflective film,
   wherein X1 is at least one alloying element selected from the group consisting of Bi and Ge,
   wherein Y1 is at least one alloying element selected from the group consisting of Nd, Sn, In and Gd, and
   wherein the concentration of X1 in the enriched layer increases in a thickness direction from the surface of the silver alloy reflective film to a depth of 2 nm from the surface of the silver alloy reflective film.

2. The silver alloy reflective film according to claim 1, wherein X1 is Bi and Ge.

3. The silver alloy reflective film according to claim 1, wherein X1 is Bi.

4. The silver alloy reflective film according to claim 1, wherein X1 is Ge.

5. An optical information recording medium comprising the silver alloy reflective film according to claim 1.

6. A silver alloy reflective film comprising:
silver;
a total of 0.01-3 atomic % of Bi;
a total of 0.01-10 atomic % of X1; and
a total of 6-20 atomic % of Y1,
wherein the silver alloy reflective film comprises an enriched layer located in a region within 2 nm deep from the surface of the silver alloy reflective film,
wherein Bi and X1 are enriched in the enriched layer at a higher concentration than the average concentration of Bi and X1 in the whole of the silver alloy reflective film,
wherein X1 is at least one alloying element selected from the group consisting of Si, Ge, Pb, Zn, Cd, Hg, Al, Ga, In, Tl, Sn, As and Sb,
wherein Y1 is at least one alloying element selected from the group consisting of Nd, Sn, In and Gd, and
wherein the concentration of Bi and X1 in the enriched layer increases in a thickness direction from the surface of the silver alloy reflective film to a depth of 2 nm from the surface of the silver alloy reflective film.

7. The silver alloy reflective film according to claim 6, wherein X1 is Ge.

8. An optical information recording medium comprising the silver alloy reflective film according to claim 6.

9. A silver alloy reflective film comprising:
silver;
a total of 0.01-3 atomic % of X1; and
a total of 6-20 atomic % of Y1,
wherein the silver alloy reflective film comprises an enriched layer located in a region within 2 nm deep from the surface of the silver alloy reflective film,
wherein X1 is enriched in the enriched layer at a higher concentration than the average concentration of X1 in the whole of the silver alloy reflective film,
wherein X1 is at least one alloying element selected from the group consisting of Bi and Ge,
wherein Y1 is at least one alloying element selected from the group consisting of Nd, Sn, In and Gd, and
wherein the concentration of X1 in the enriched layer decreases in a thickness direction from the surface of the silver alloy reflective film to a depth of 2 nm from the surface of the silver alloy reflective film.

10. The silver alloy reflective film according to claim 9, wherein X1 is Bi and Ge.

11. The silver alloy reflective film according to claim 9, wherein X1 is Bi.

12. The silver alloy reflective film according to claim 9, wherein X1 is Ge.

13. An optical information recording medium comprising the silver alloy reflective film according to claim 9.

14. A silver alloy reflective film comprising:
silver;
a total of 0.01-3 atomic % of Bi;
a total of 0.01-10 atomic % of X1; and
a total of 6-20 atomic % of Y1,
wherein the silver alloy reflective film comprises an enriched layer located in a region within 2 nm deep from the surface of the silver alloy reflective film,
wherein Bi and X1 are enriched in the enriched layer at a higher concentration than the average concentration of Bi and X1 in the whole of the silver alloy reflective film,
wherein X1 is at least one alloying element selected from the group consisting of Si, Ge, Pb, Zn, Cd, Hg, Al, Ga, In, Tl, Sn, As and Sb,
wherein Y1 is at least one alloying element selected from the group consisting of Nd, Sn, In and Gd, and
wherein the concentration of Bi and X1 in the enriched layer decreases in a thickness direction from the surface of the silver alloy reflective film to a depth of 2 nm from the surface of the silver alloy reflective film.

15. The silver alloy reflective film according to claim 14, wherein X1 is Ge.

16. An optical information recording medium comprising the silver alloy reflective film according to claim 14.

* * * * *